United States Patent
Muemmler et al.

(10) Patent No.: US 7,952,138 B2
(45) Date of Patent: May 31, 2011

(54) MEMORY CIRCUIT WITH FIELD EFFECT TRANSISTOR AND METHOD FOR MANUFACTURING A MEMORY CIRCUIT WITH FIELD EFFECT TRANSISTOR

(75) Inventors: Klaus Muemmler, Dresden (DE); Peter Baars, Dresden (DE); Stefan Tegen, Dresden (DE)

(73) Assignee: Qimonda AG, Munich (DE)

( * ) Notice: Subject to any disclaimer, the term of this patent is extended or adjusted under 35 U.S.C. 154(b) by 789 days.

(21) Appl. No.: 11/825,228

(22) Filed: Jul. 5, 2007

(65) Prior Publication Data
US 2009/0008694 A1 Jan. 8, 2009

(51) Int. Cl.
H01L 29/76 (2006.01)
H01L 29/94 (2006.01)

(52) U.S. Cl. .................................. 257/330; 257/331

(58) Field of Classification Search .................. 257/306, 257/328–332, E27.088, E27.097, E29.27
See application file for complete search history.

(56) References Cited

U.S. PATENT DOCUMENTS

| | | | |
|---|---|---|---|
| 6,504,200 B2 * | 1/2003 | Schlosser et al. | 257/301 |
| 6,740,917 B2 | 5/2004 | Beer | |
| 2002/0079527 A1 | 6/2002 | Schlosser et al. | |
| 2006/0124976 A1 | 6/2006 | Adkisson et al. | |
| 2006/0258084 A1 | 11/2006 | Tang et al. | |
| 2006/0270150 A1 | 11/2006 | Lee | |

FOREIGN PATENT DOCUMENTS

| | | |
|---|---|---|
| DE | 10134101 | 1/2003 |
| JP | 08097419 | 4/1994 |
| WO | WO 99/43029 | 8/1999 |

* cited by examiner

*Primary Examiner* — Hung Vu
(74) *Attorney, Agent, or Firm* — Fay Kaplun & Marcin, LLP

(57) ABSTRACT

An integrated circuit includes a field effect transistor formed in an active area segment of a semiconductor substrate. The transistor comprises: a first source/drain contact region including a first vertical extension and a second source/drain contact region including a second vertical extension and a channel region formed around a recessed channel transistor groove, the groove being formed in the active area segment and extending to a groove depth larger than a lower first contact region depth, wherein the second vertical extension of the second source/drain contact region is arranged above the first extension of the first source/drain contact region, and wherein the recessed channel transistor groove is filled with a conductive gate material at a groove depth lower than the first contact region depth.

11 Claims, 12 Drawing Sheets

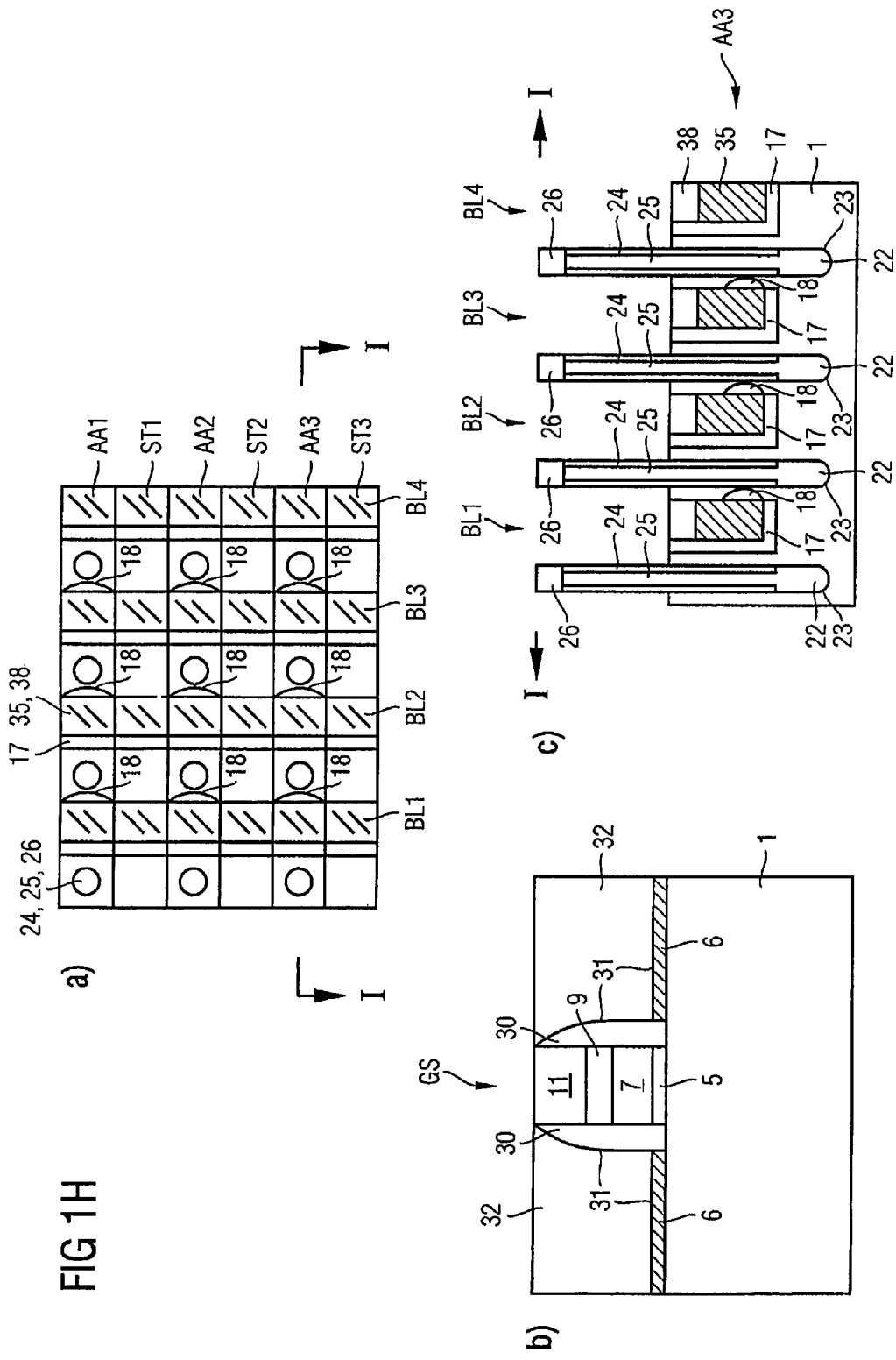

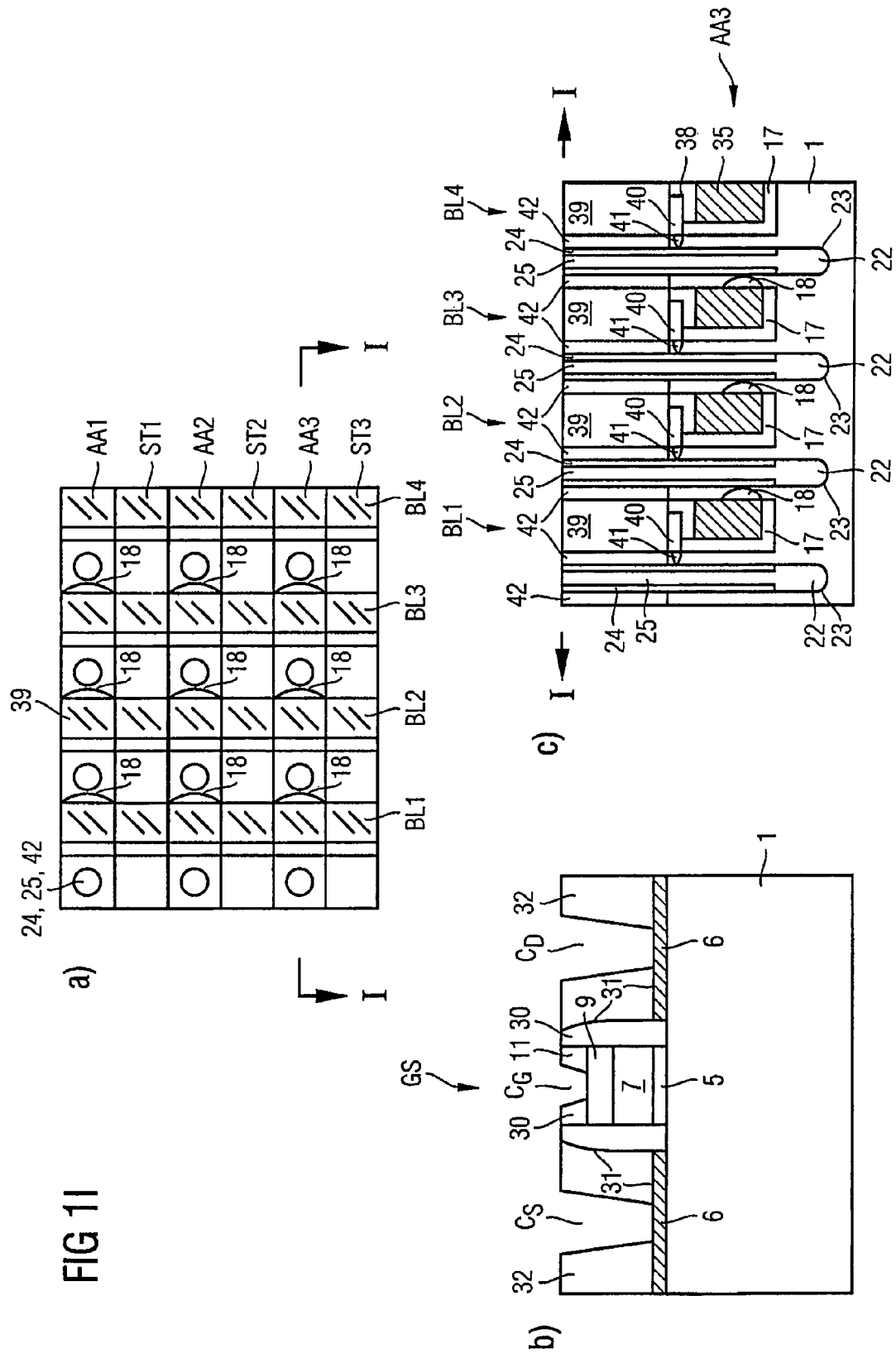

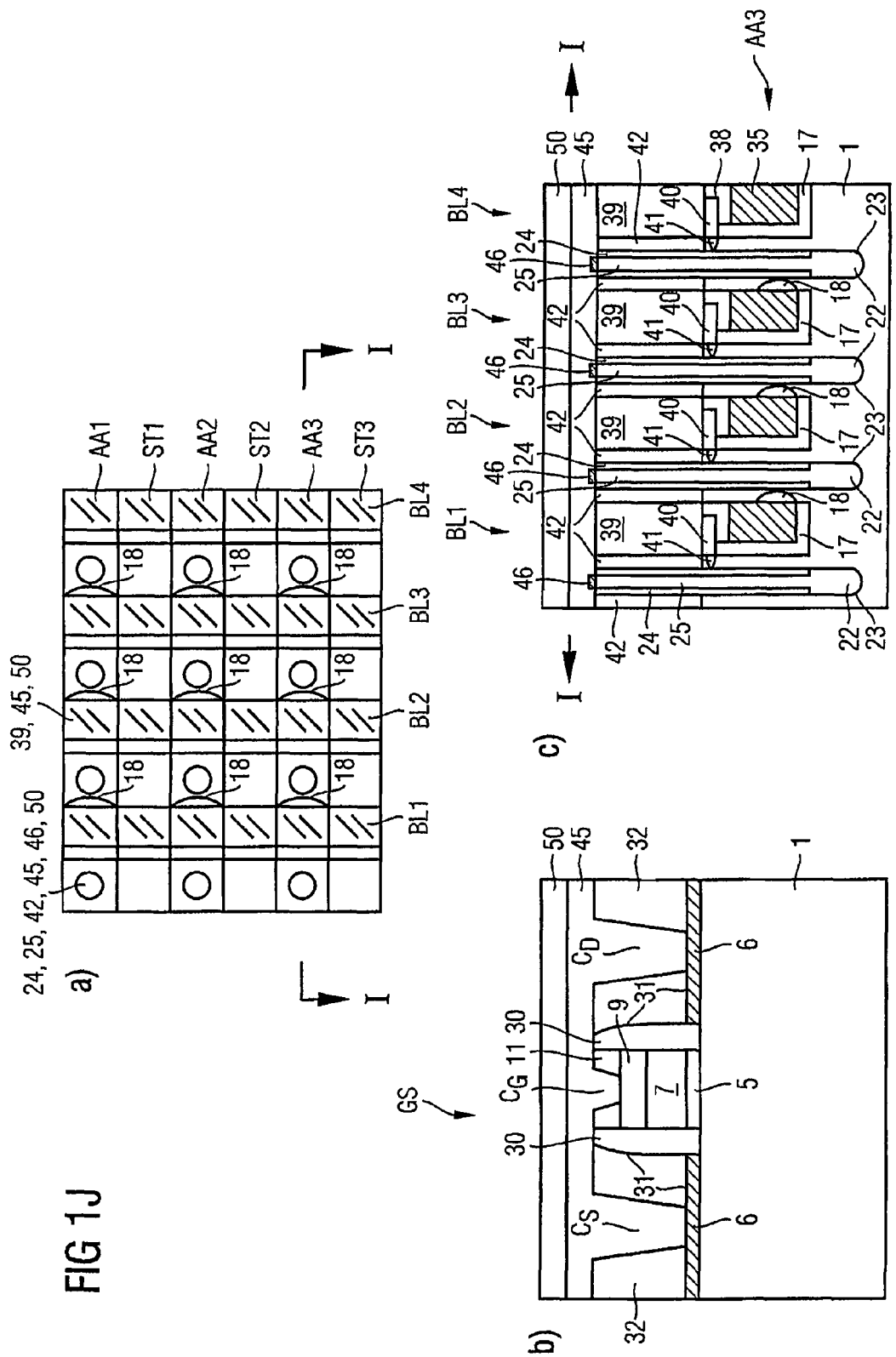

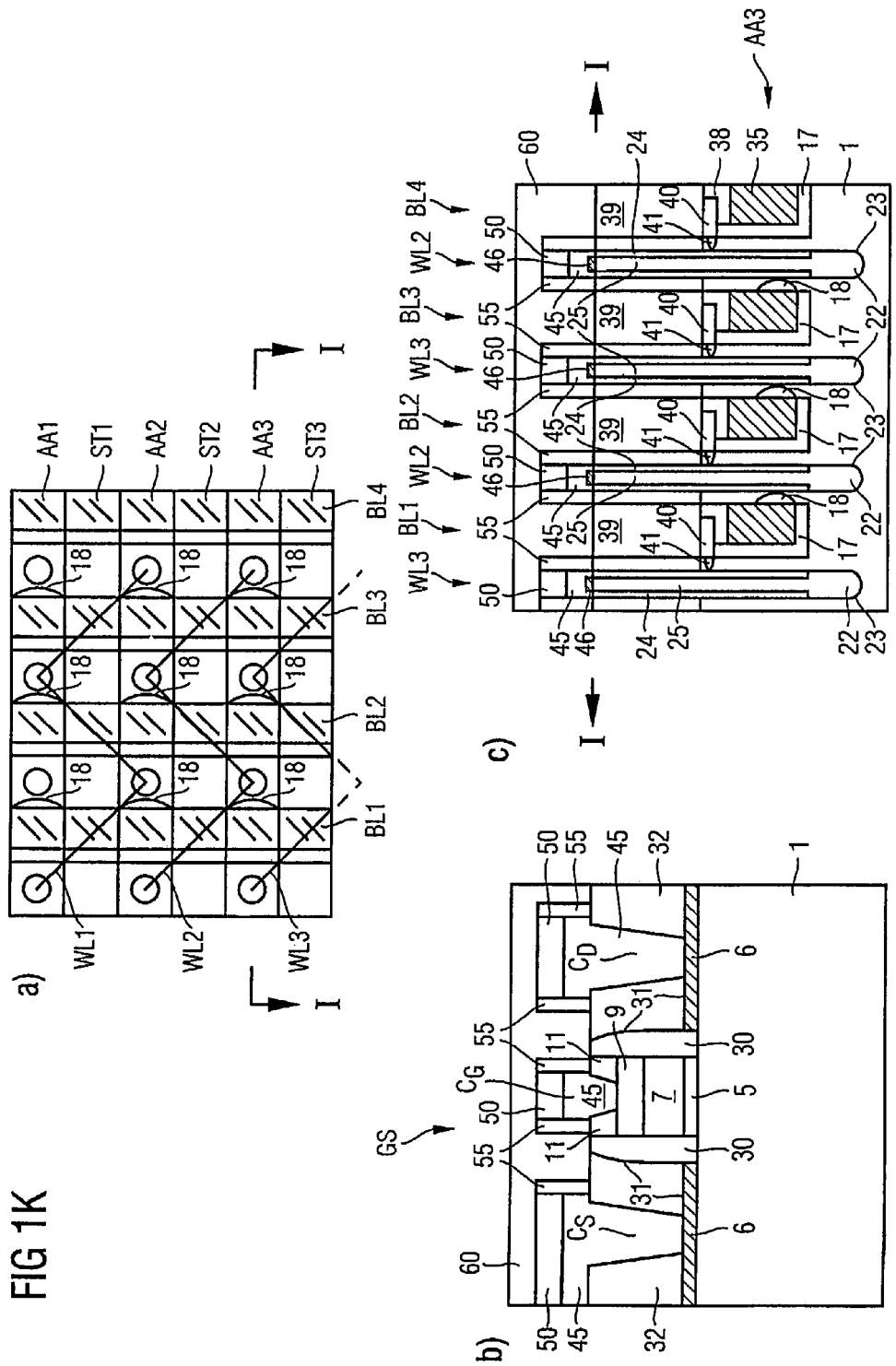

MEMORY CIRCUIT WITH FIELD EFFECT TRANSISTOR AND METHOD FOR MANUFACTURING A MEMORY CIRCUIT WITH FIELD EFFECT TRANSISTOR

BACKGROUND OF THE INVENTION

1. Field of the Invention

The present invention relates to an integrated circuit and a corresponding manufacturing method.

2. Description of the Related Art

Although in principle applicable to arbitrary integrated circuit devices, the following invention and the underlying problems will be explained with respect to integrated DRAM memory circuits in silicon technology, in particular, DRAM technology which is scaled down to below 100 nm generation and provides big challenges.

DRAM memory circuits of today usually comprise stripe-like active areas, e.g. fabricated in silicon, separated by STI insulation trenches filled with a dielectric material such as silicon oxide.

With feature sizes that are becoming smaller and smaller and nowadays are well below 100 nm, it becomes a challenging task to form memory cells with minimum spatial extension, e.g. $4F^2$, where F is the critical dimension of the used patterning technology. Also contact etching and etching mask openings for grooves for EUD (Extended U-Groove Device) transistors in the active area stripes between adjacent memory cell capacitors in a manner which is reliable and reproducible in mass production becomes more and more difficult.

BRIEF SUMMARY OF THE INVENTION

Various aspects of the invention are listed in independent claims 1, 9, 14, 23, and 30, respectively.

Further aspects are listed in the respective dependent claims.

DESCRIPTION OF THE DRAWINGS

In the Figures:

FIG. 1A-L show schematic layouts for illustrating a manufacturing method for a recessed channel transistor in an memory device according to an embodiment of the present invention, namely a) as plain view in a memory cell array area, b) a cross-section along a support device transistor processed in parallel in a peripheral support device area, and c) as cross-section along line I-I of a).

In the Figs, identical reference signs denote equivalent or functionally equivalent components.

DESCRIPTION OF THE PREFERRED EMBODIMENTS

FIG. 1A-L show schematic layouts for illustrating a manufacturing method for a recessed channel transistor in an memory device according to an embodiment of the present invention, namely a) as plain view in a memory cell array area, b) a cross-section along a support device transistor processed in parallel in a peripheral support device area, and c) as cross-section along line I-I of a).

Figure 1A:
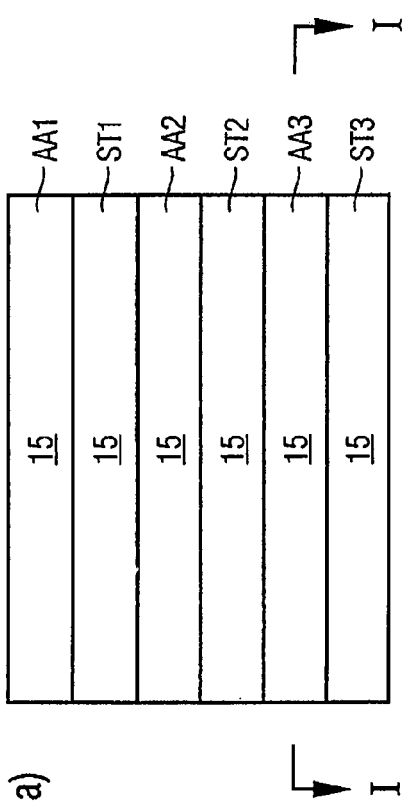
Figure 1A:
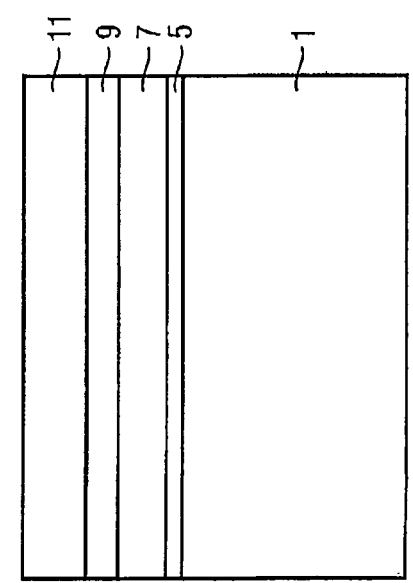
Figure 1A:
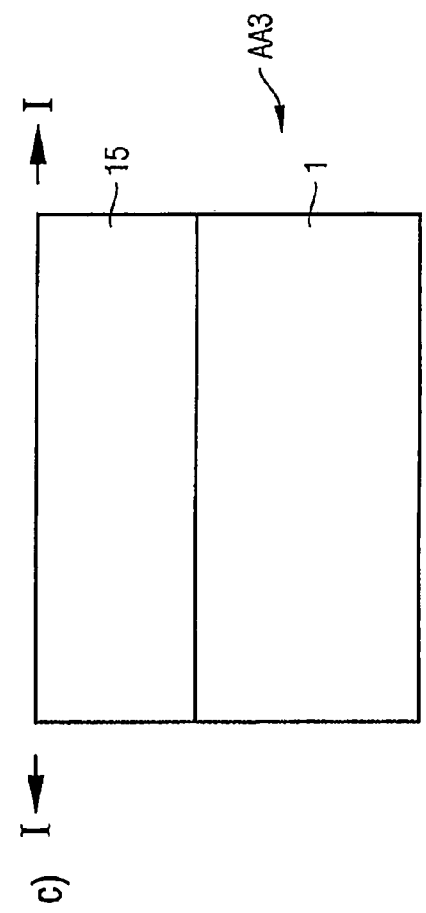

In FIG. 1A, reference sign 1 denotes a silicon semiconductor substrate. Formed in said silicon semiconductor substrate 1 are a plurality of parallel active area lines AA1, AA2, AA3, separated by a segmentation structure made of parallel shallow isolation trenches ST1, ST2, ST3 filled with a di-electric material, such as silicon oxide 15 (also called isolation segments). In this example, the silicon oxide layer 15 is also provided on top of said active area lines AA1, AA2, AA3, as may be obtained from FIG. 1A, c).

As becomes apparent from FIG. 1A, b), in the peripheral support device area, a gate dielectric layer 5 of silicon oxide, a polysilicon layer 7, a metal silicide layer 9, and a silicon nitride layer 11 have been formed sequentially on top of each other. This layer structure 5, 7, 9, 11 in the peripheral support device area forms the basic structure of the gate of a support MOSFET-transistor.

It should be mentioned that the layers 5, 7, 9, 11 are formed over the entire wafer, and thereafter are removed in the memory cell array using a support block mask/etch technique.

In the forming steps for providing the layer structure 5, 7, 9, 11, the final thickness of the oxide layer 15 is adjusted such that the upper surface of the layers 11 and 15 is essentially on the same height level. In other words, the wafer which carries these structures has a planar surface.

Figure 1B:
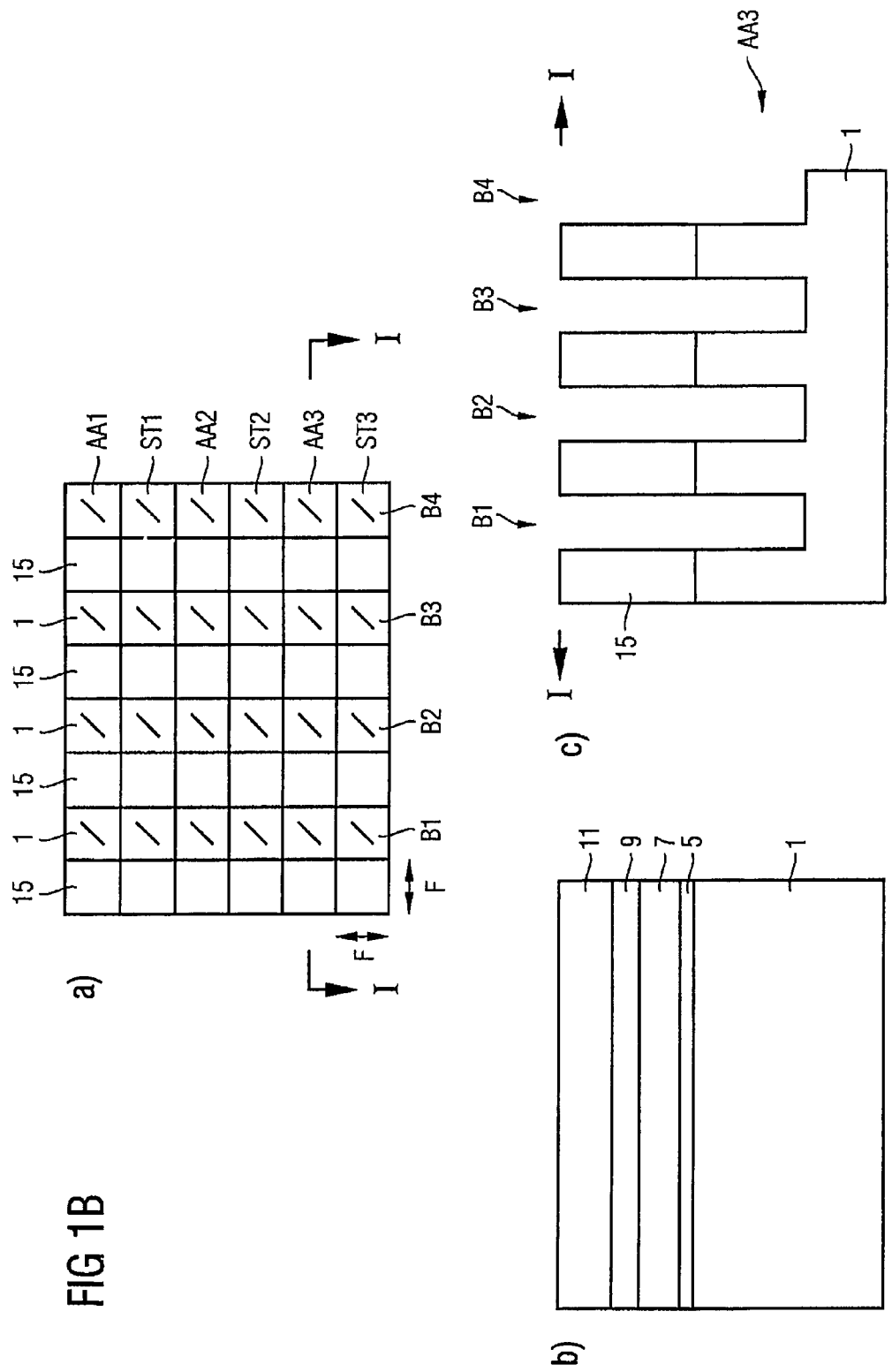

Further, with reference to FIG. 1B, a lithography/etch step is performed in the memory cell array area in order to form a plurality of parallel bitline trenches B1, B2, B3, B4 running in parallel and perpendicular to said active area lines AA1, AA2, AA3 and shallow isolation trenches ST1, ST2, ST3. Particularly, the etch step is a combined oxide/polysilicon.

In order to protect the peripheral support device area during the etching, a block mask made of carbon or another hart mask material can be formed on the peripheral support device area.

It should be mentioned here that the structuring of the memory cell array area can be performed with the minimum feature size F of the used patterning technology (see FIG. 1B, a)).

Figure 1C:
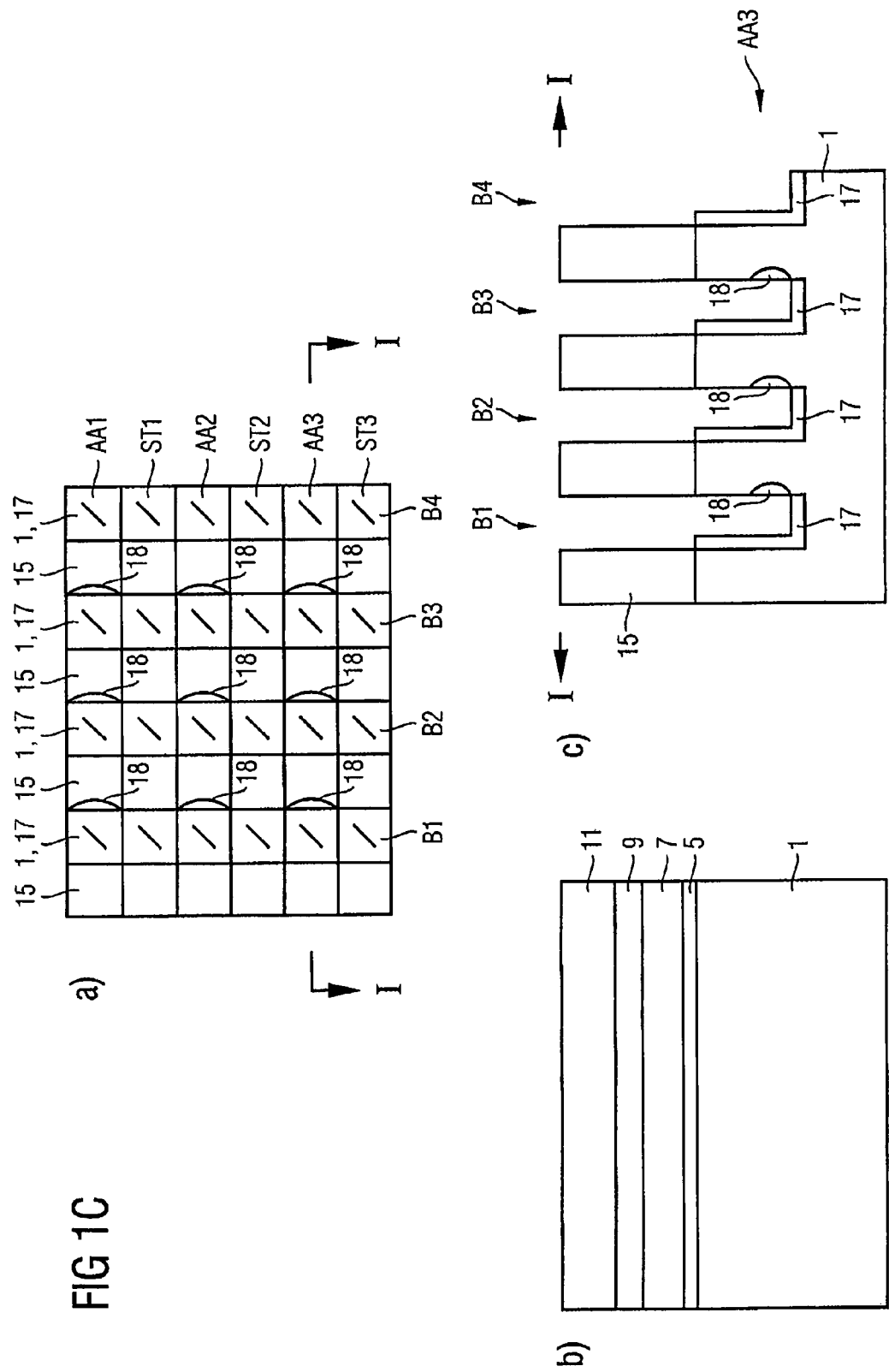
Figure 1D:
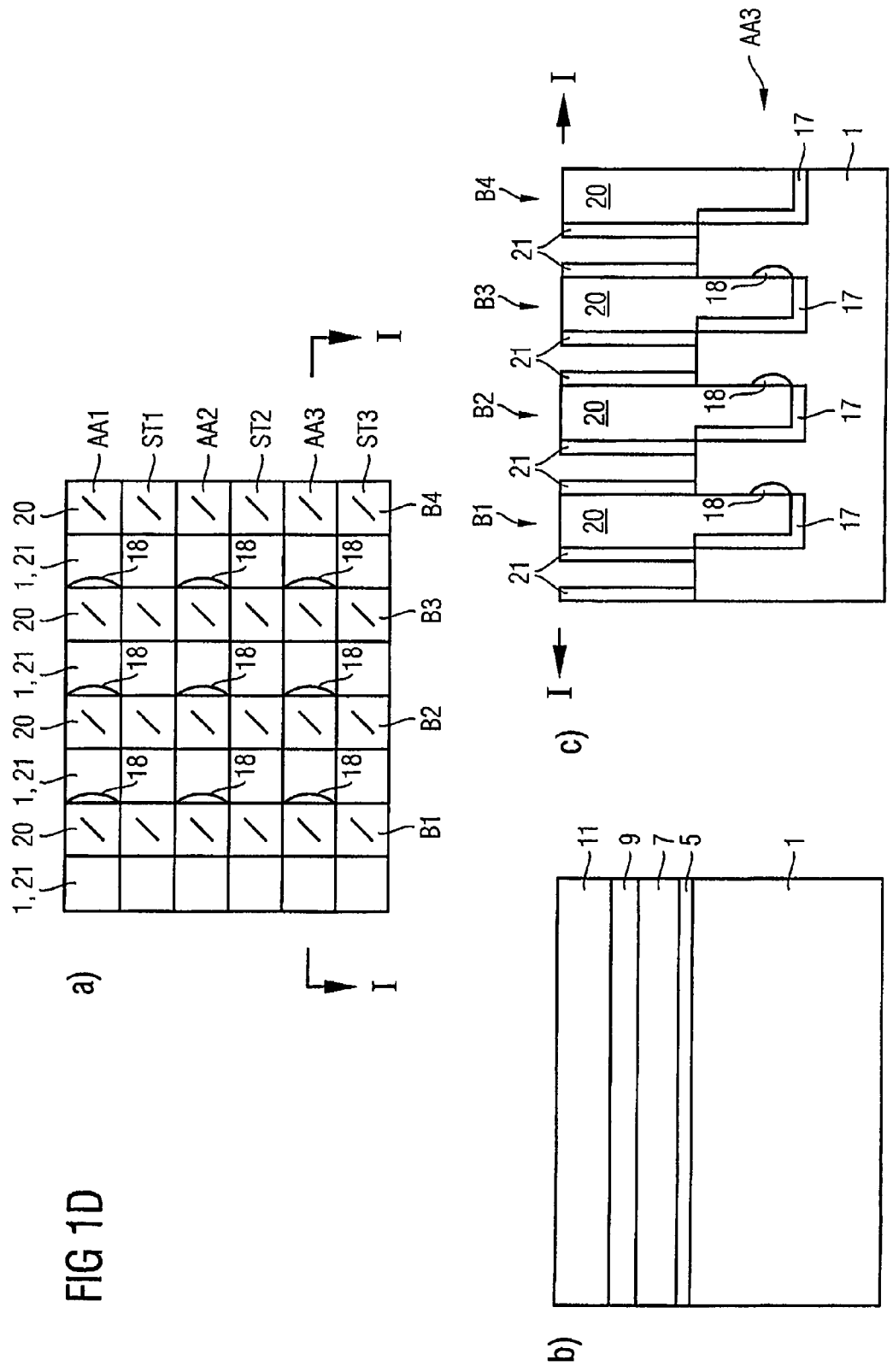

In a subsequent process step which is seen in FIG. 1C, single sided bitline contacts 18 are formed in the active area lines AA1, AA2, AA3 using standard techniques, for example a liner out-diffusion technique or a implantation technique. It should be mentioned that the bitline contacts 18 are locations of enhanced doping concentration in the silicon substrate 1. Thereafter or in combination with the contact formation technique, essentially L-shaped isolating liners 17 made of silicon oxide are formed in the bitline trenches B1, B2, B3, B4 such that only the bitline trench sidewalls are exposed where the bitline contacts 18 are provided in the silicon substrate 1.

After formation of the bitline contacts 18 and the L-shaped isolation liner 17 in the bitline trenches B1, B2, B3, B4, a sacrificial nitride layer 20 is deposited and planarized over the entire structure. Thereafter, the peripheral support device area is protected by a support block mask again, and then the oxide layer 15 is stripped in the memory cell array area in an etch step which is selective with respect to silicon nitride and silicon. Subsequently, silicon nitride spacers 21 are formed on the side walls of the protruding pillars of the sacrificial nitride layer 20. This leads to the process state shown in FIG. 1D.

By forming bitline trenches B1, B2, B3, B4 with a sacrificial nitride layer 20, it is possible to perform high-temperature processes for peripheral devices without damaging the bitlines later. The nitride spacers 21 solve the purpose to define the size of mask openings of a nitride mask used in a subsequent etch step for forming grooves of recessed channel transistors arranged in the substrate 1 between neighboring bitline trenches along the active area lines AA1, AA2, AA3.

Figure 1E:
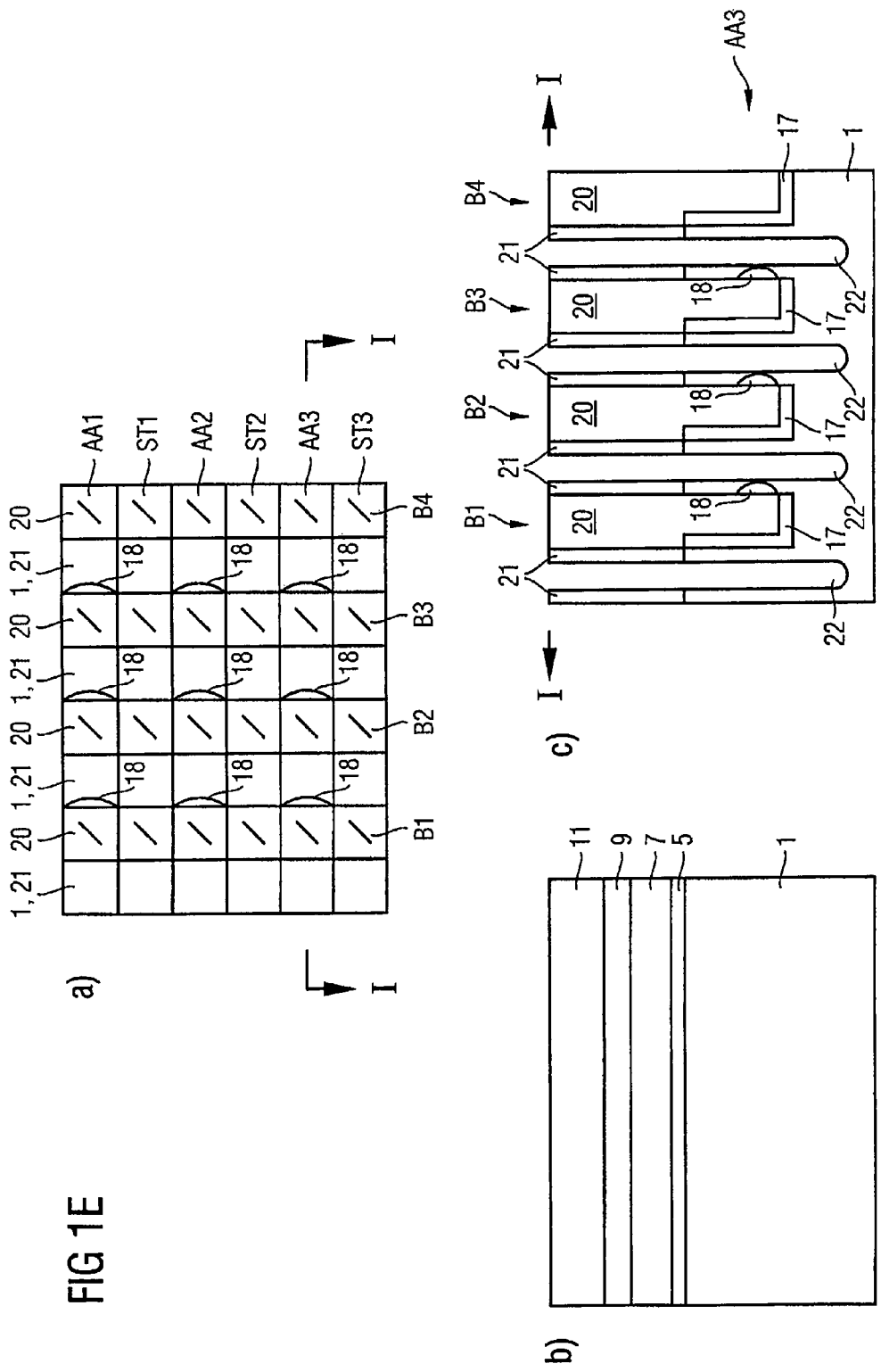

Thereafter, as shown in FIG. 1E, a highly selective polysilicon etch step is performed wherein the silicon nitride layer 20 and the silicon nitride spacer 21 are used as a mask. In this polysilicon etch step, recessed channel transistor grooves 22 are formed in the silicon substrate 1 between pairs of neighboring bitline trenches B1, B2, B3, B4. It should be explicitly mentioned that in this polysilicon etch step, polysilicon is etched selectively with respect to silicon nitride and silicon oxide.

Figure 1F:
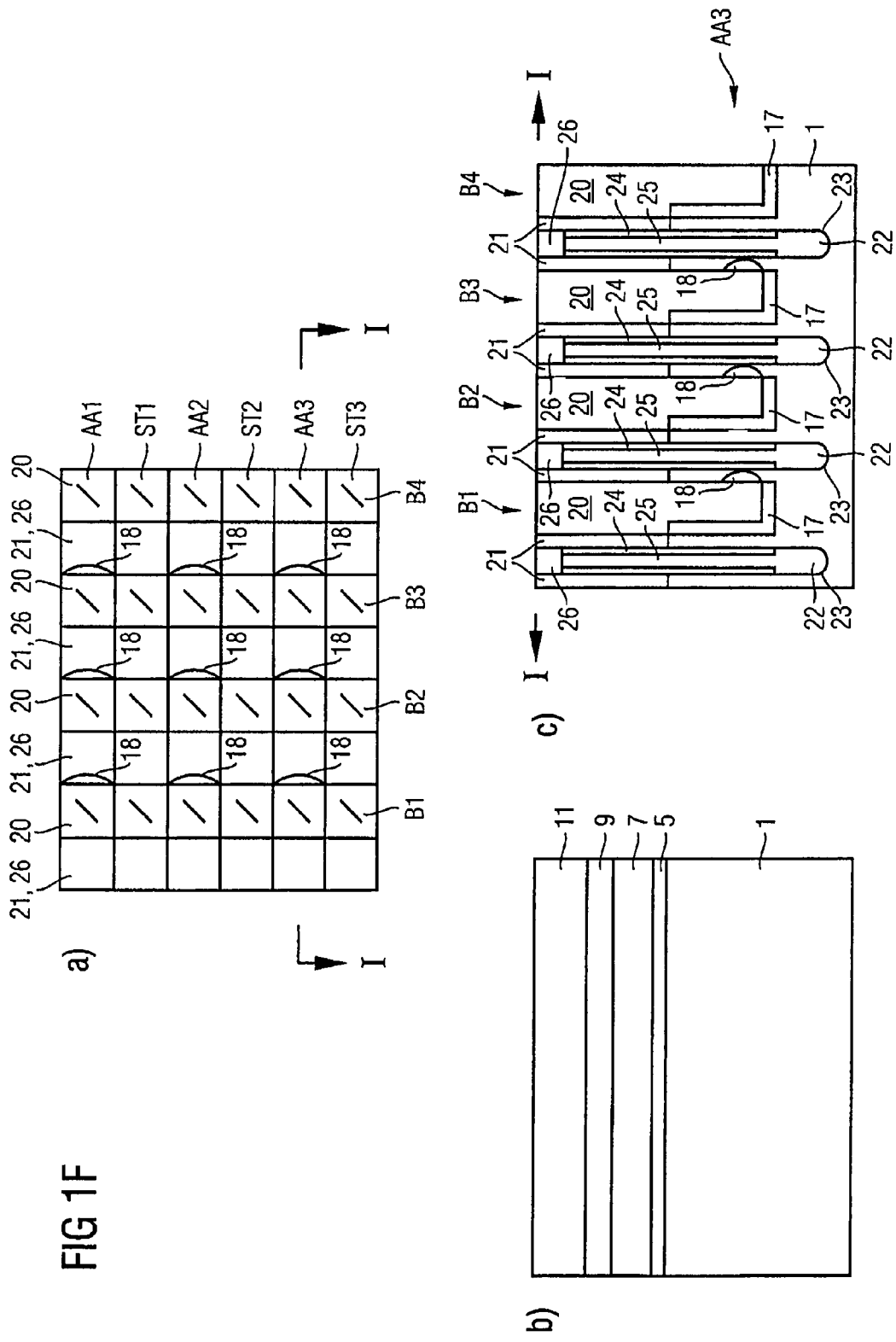

As shown in FIG. 1F, a gate dielectric layer 23 is formed in the recessed channel transistor grooves 22, e.g. in a thermal oxidation step of the silicon substrate 1. An oxide liner 24 is formed only in the upper part of the recessed channel array transistor grooves 22 and on the silicon nitride spacers 21. This may be achieved by forming shallow grooves 22, depositing and backetching said liner 24, and etching deeper said grooves 22 (for sake of simplicity not depicted here).

In a next step, a polysilicon fill 25 is formed in said recessed channel array transistor grooves 22 in a deposition and etch-back or deposition and polish-back step. Finally, the oxide liner 24 and the polysilicon fill 25 are recessed, and an oxide plug is formed on top of said liner 24 and fill 25. Said oxide plug 26 extends to the same upper level as said nitride layer 20 and nitride spacers 21.

Figure 1G:
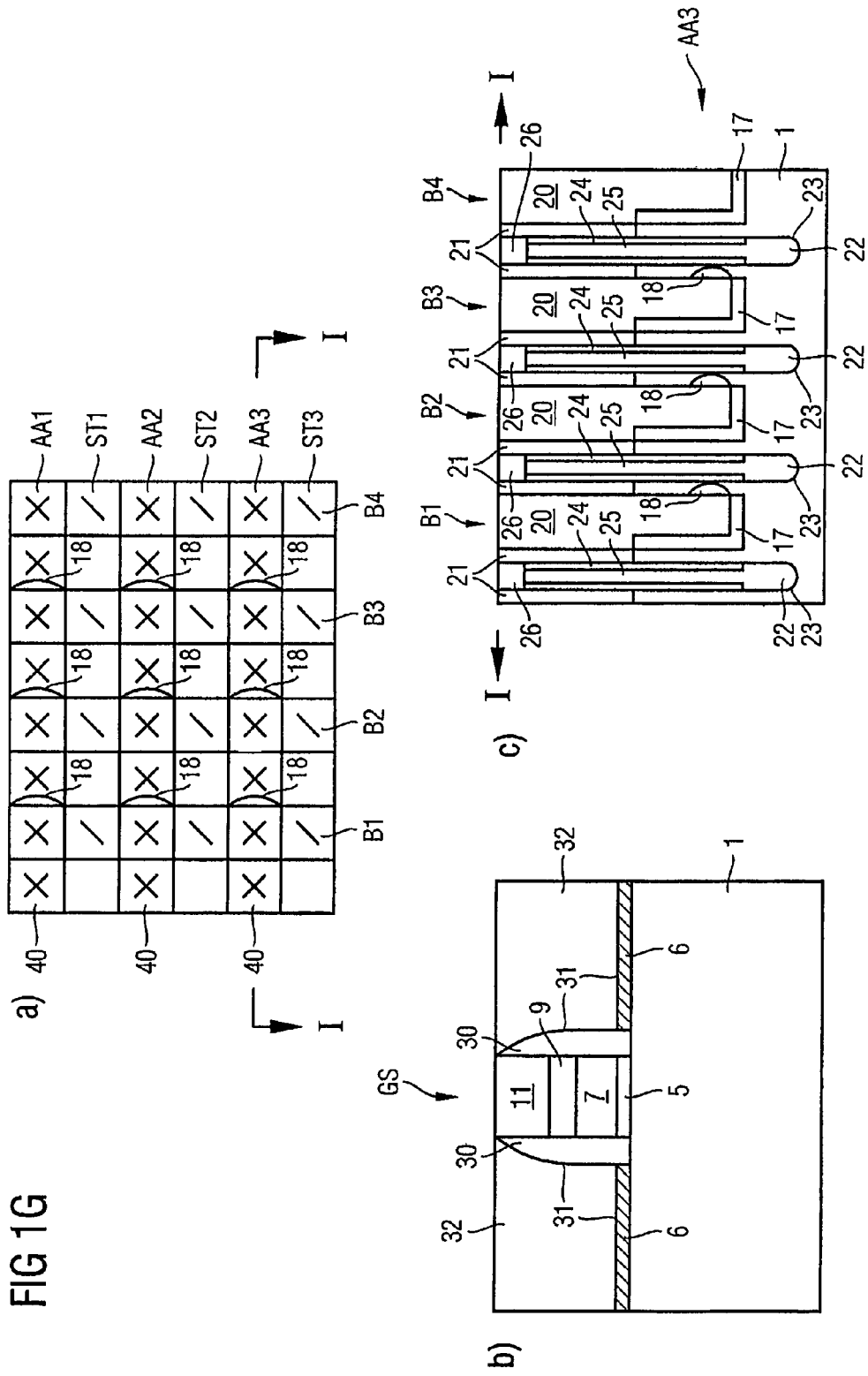

As may be obtained from FIG. 1G, a photoresist mask is formed in the memory cell array area comprising a plurality of photoresist stripes 40 which cover the respective active area lines AA1, AA2, AA3. Thereafter, an oxide etch step and a polysilicon etch step are performed in order to separate the polysilicon fill 25 and the oxide plugs 26 of the individual active area lines AA1, AA2, AA3.

Then, a carbon hard mask (not shown) is formed over the entire structure, i. e. over the peripheral support device area and over the memory cell array area. Thereafter, this hard mask is structured according to a desired peripheral device gate stack structuring pattern. In FIG. 1G, b) the structure of a single peripheral support device gate stack GS is shown. Subsequently, oxide spacers 30 are formed on the sidewalls of the peripheral support device gate stack GS. Moreover, CoSi areas 6 corresponding to the drain and source contact areas of the corresponding peripheral device are formed on both sides of the oxide spacers 30. Optionally, a silicide blocking nitride liner (not shown) can be formed prior to the CoSi areas 6 formation. Thereafter, a strain liner 31 is formed on top of the CoSi liner and on top of the oxide spacers 30. Finally, a spin-on glass layer 32 is deposited over the peripheral support device area, and then, the memory cell array area and peripheral support device area are brought to the same upper level, e. f. in a polish-back or etch-back step.

In a next process step which is shown in FIG. 1H, the peripheral support device area is protected with another support block mask (not shown). Then, the nitride layer 20 and the nitride spacers 21 are stripped in the memory cell array area in a corresponding nitride etch step. This nitride etch step exposes the bitline trenches B1, B2, B3, B4 including the L-shaped oxide spacers 17 and the bitline contacts 18. Thereafter, a (not shown) Ti/TiSi liner is formed in the bitline trenches B1, B2, B3, B4. Then, a tungsten layer 35 is deposited and recessed in the bitline trenches B1, B2, B3, B4 in order to form buried bitlines BL1, BL2, BL3, BL4 which are electrically connected to respective bitline contacts 18 of the individual active area lines AA1, AA2, AA3.

In a next process step, an oxide layer 38 is deposited and recessed in order to form oxide plugs 38 which electrically insulate the bitlines BL1, BL2, BL3, BL4 on the upper sides.

As shown in FIG. 1I, nitride spacers 42 are formed on the exposed oxide spacers 24 over the polysilicon pillars 25. Then, in a self-aligned process, an oxide etch step is performed in order to remove an oxide area from the L-shaped oxide spacers 17 and the oxide plugs 38 for a subsequent formation of contact areas 41 in the silicon substrate 1 and buried landing contact pads 40 made of polysilicon above and electrically insulated from said buried bitlines BL1, BL2, BL3, BL4.

Finally, an oxide layer 39 is deposited and polished back to the upper level of said polysilicon pillars 25 so as to form oxide plugs 39 above said buried bitlines BL1, BL2, BL3, BL4 and between said nitride spacers 42.

In a next process step, source, gate, and drain contacts $C_S$, $C_G$ and $C_D$ are formed in the peripheral support device area in lithography/etch steps, as may be obtained from FIG. 1I, b).

It should also be mentioned here that (not shown) contacts to the buried bitlines BL1, BL2, BL3, BL4 are formed at the edge of the memory cell area in a process step which is not illustrated here, but is well-known to the average persons skilled in the art.

As shown in FIG. 1J, TiSi regions 46 are formed on the exposed polysilicon pillars 25 in a silicidation process step, and thereafter, a tungsten layer 45 and a silicon nitride cap layer 50 are deposited over the entire structure, i. e. over the peripheral support device area and the memory cell array area.

As shown in FIG. 1K, layers 45, 50 are patterned into lines in a lithography/etch step and thereafter a nitride spacers 55 are formed at the sidewalls of the so-formed lines to completely encapsulate them.

In the memory cell array area, layers 45, 40 are patterned into wordlines WL1, WL2, WL3 having a zig-zag shape and running in parallel as indicated in FIG. 1K, a). In the peripheral support device area, the layers 45, 40 are patterned into source, drain, and gate connection lines which contact the source, gate, and drain contacts $C_S$, $C_G$ and $C_D$, respectively.

Figure 1L:
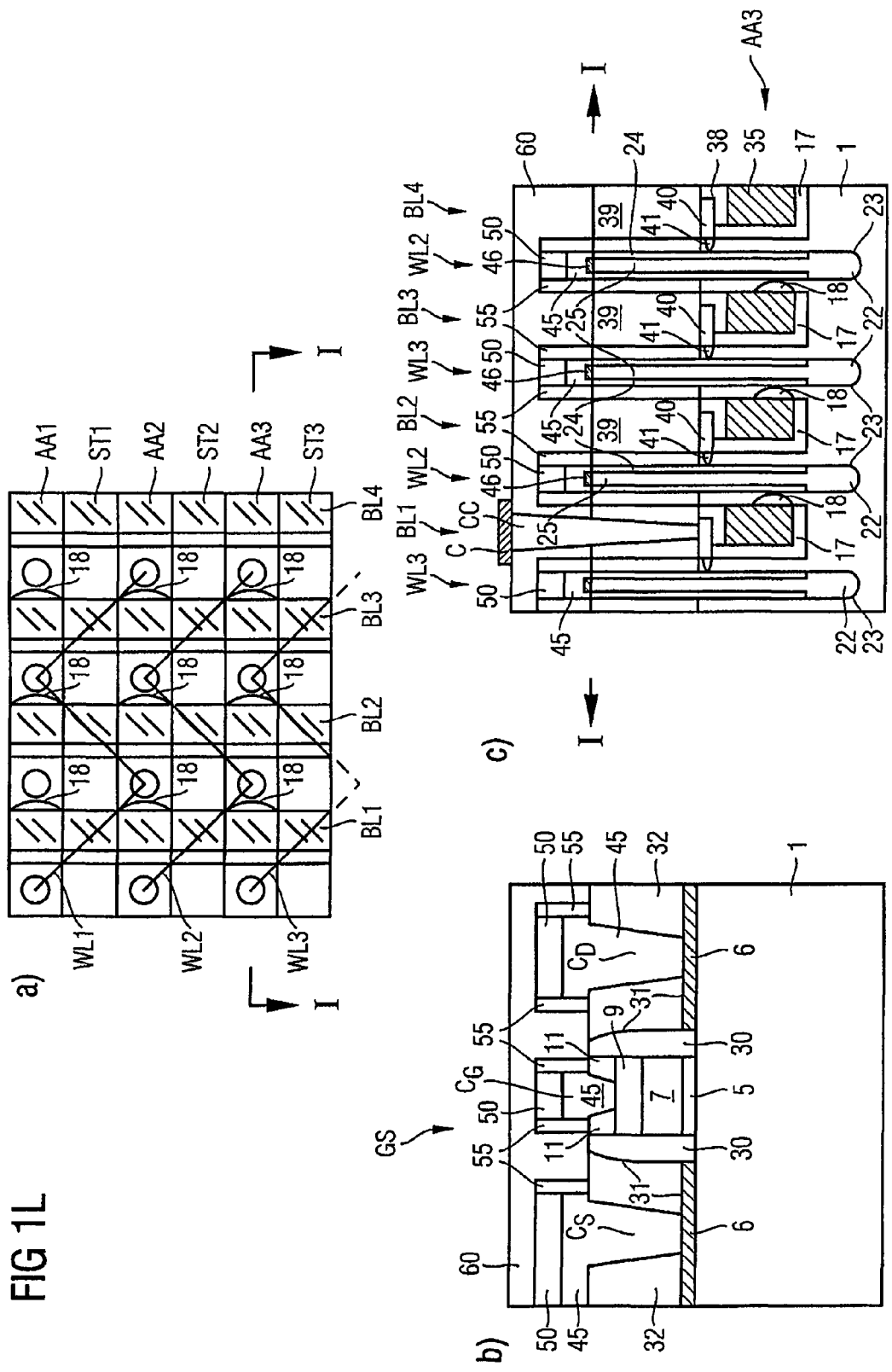

In a subsequent process step, an oxide layer 60 is deposited and planarized over the entire structure. In a final process step sequence, which is illustrated in FIG. 1L, capacitor contacts CC made of polysilicon are formed in a corresponding lithography/etch/deposit/polish process step sequence in order to contact the buried silicon landing contact pads 40. The capacitor contacts CC can be formed in self-adjusting manner with respect to the wordlines WL1, WL2, WL3 and savely land on the buried polysilicon contacts 40.

Finally, corresponding stack capacitors C are formed in electrical contact with the capacitor contacts CC on top of the oxide layer 60. It should be mentioned here that for reasons of clarity, only a single capacitor contact CC and capacitor C are depicted in FIG. 1L, however, in reality, a respective capacitor contact CC and capacitor C is associated with each of the buried polysilicon landing pads 40.

Thus, after this process step, a $4F^2$ memory cell array has been completed which is easily and robustly manufacturable.

Although the present invention has been described with reference to a preferred embodiment, it is not limited thereto, but can be modified in various manners which are obvious for a person skilled in the art. Thus, it is intended that the present invention is only limited by the scope of the claims attached herewith.

In particular, the present invention is not limited to the material combinations referred to in the above embodiments. Moreover, the invention is applicable for any kind of memory such as DRAM, SRAM, ROM, NVRAM etc., and also for other kind of integrated circuit devices that use recessed channel transistors.

What is claimed is:

1. An integrated circuit including a field effect transistor formed in an active area segment of a semiconductor substrate, the transistor comprising:

a first source/drain contact region including a first vertical extension and a second source/drain contact region including a second vertical extension; and a channel region formed around a recessed channel transistor groove, the groove being formed in the active area segment and extending to a groove depth larger than a lower first contact region depth, wherein the second vertical extension of the second source/drain contact region is arranged above the first extension of the first source/drain contact region, and wherein the recessed channel transistor groove is filled with a conductive gate material at a groove depth lower than the first contact region depth.

2. The integrated circuit according to claim 1, wherein a first contact element adjoins the first source/drain contact region and a second contact element adjoins the second source/drain contact region.

3. The integrated circuit according to claim 2, wherein at least one of the first and second contact elements comprise a metal line.

4. The integrated circuit according to claim 1, wherein the second source/drain contact region is located on a side of the active area segment opposite to the first source/drain contact region, and said recessed channel transistor groove is arranged between the first and the second source/drain contact region.

5. The integrated circuit according to claim 1, wherein the integrated circuit is formed on a semiconductor material, and the first source/drain contact region is located below the surface of the semiconductor material.

6. The integrated circuit according to claim 5, wherein the first source/drain contact region is located in an isolation trench.

7. The integrated circuit according to claim 5, wherein the second source/drain contact region is located below the surface of the semiconductor material.

8. The integrated circuit according to claim 1, wherein a gate dielectric layer is disposed between the gate material and the channel region.

9. The integrated circuit according to claim 1, wherein the integrated circuit is a memory device.

10. The integrated circuit according to claim 9, wherein the integrated circuit is a DRAM.

11. The integrated circuit according to claim 10, wherein the transistor is a selection transistor of a memory cell.

* * * * *